(12) United States Patent
Cho et al.

(10) Patent No.: US 10,512,184 B2
(45) Date of Patent: Dec. 17, 2019

(54) ELECTRONIC DEVICE INCLUDING WATERPROOF STRUCTURE

(71) Applicant: Samsung Electronics Co., Ltd, Suwon-si (KR)

(72) Inventors: Jae Myung Cho, Suwon-si (KR); Jae Woo Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/956,037

(22) Filed: Apr. 18, 2018

(65) Prior Publication Data
US 2018/0310426 A1    Oct. 25, 2018

(30) Foreign Application Priority Data
Apr. 21, 2017    (KR) .................. 10-2017-0051486

(51) Int. Cl.
*H05K 5/06*  (2006.01)
*G06F 1/16*  (2006.01)
*H04M 1/02*  (2006.01)
*H04M 1/18*  (2006.01)
*H05K 5/00*  (2006.01)
*H05K 5/03*  (2006.01)

(52) U.S. Cl.
CPC ........... *H05K 5/069* (2013.01); *G06F 1/1637* (2013.01); *G06F 1/1656* (2013.01); *H04M 1/0266* (2013.01); *H04M 1/18* (2013.01); *H05K 5/0017* (2013.01); *H05K 5/03* (2013.01); *G06F 1/163* (2013.01); *G06F 1/1626* (2013.01)

(58) Field of Classification Search
CPC ........ H05K 5/069; H05K 5/0017; H05K 5/03; H04M 1/18; H04M 1/0266; G06F 1/1656; G06F 1/1637; G06F 1/1626; G06F 1/163
See application file for complete search history.

(56) References Cited

U.S. PATENT DOCUMENTS

2008/0081679 A1* 4/2008 Kawasaki ............ H04B 1/3888
                                                             455/575.8
2015/0245513 A1* 8/2015 Moon ....................... G06F 1/20
                                                             361/679.01
(Continued)

OTHER PUBLICATIONS

Communication from a foreign patent office in a counterpart foreign application, European Patent Office, "European Search Report," Application No. 18168200.6, dated Sep. 17, 2018.

*Primary Examiner* — Abhishek M Rathod

(57) ABSTRACT

An electronic device is disclosed. The electronic device includes a housing comprising a first face, a second face that faces opposite the first face, and a side face that encloses a space between the first face and the second face. The electronic device also includes a front plate disposed on the first face of the housing, and a display disposed between at least a partial region of the front plate and the first face, and comprises a first and a second layer. The electronic device further includes at least one first seal member disposed between an edge portion of the display and the first face, and at least one second seal member disposed between an edge portion of the front plate and the first face. The electronic device also includes a waterproof filler applied to fill a step region formed between the first seal member and the second seal member.

10 Claims, 14 Drawing Sheets

(56) References Cited

U.S. PATENT DOCUMENTS

| | | | |
|---|---|---|---|
| 2015/0256658 A1* | 9/2015 | Shin | G06F 1/1637 |
| | | | 455/566 |
| 2016/0066412 A1* | 3/2016 | Choi | G06F 1/1626 |
| | | | 361/704 |
| 2016/0229589 A1 | 8/2016 | Rich | |
| 2016/0350053 A1 | 12/2016 | Kim et al. | |
| 2017/0063421 A1* | 3/2017 | Moon | H04B 1/3888 |
| 2017/0099742 A1* | 4/2017 | Choi | H04M 1/18 |
| 2017/0215290 A1* | 7/2017 | Bathiche | H05K 5/0017 |

* cited by examiner

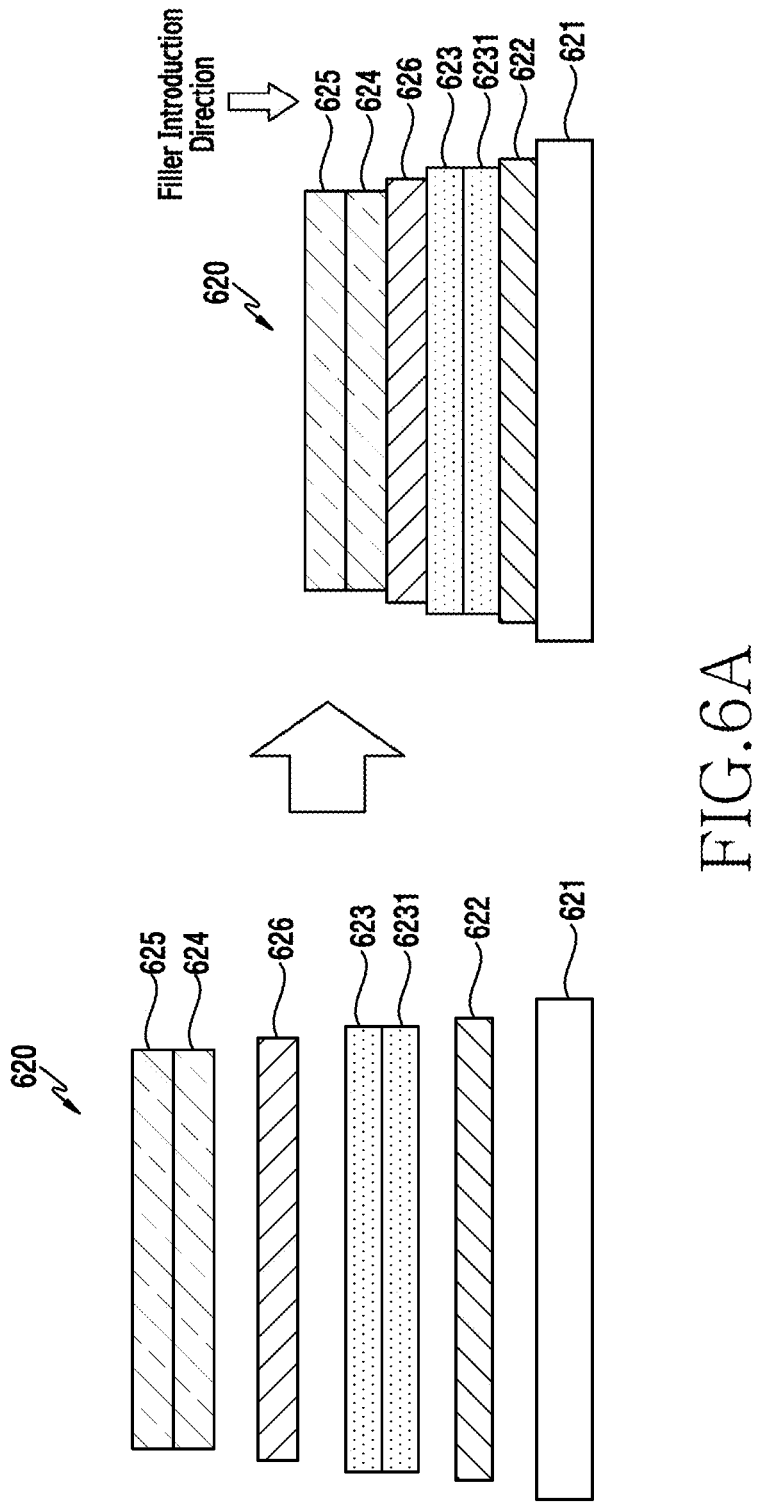

ELECTRONIC DEVICE INCLUDING WATERPROOF STRUCTURE

CROSS-REFERENCE TO RELATED APPLICATION(S) AND CLAIM OF PRIORITY

This application is based on and claims priority under 35 U.S.C. § 119 to Korean Patent Application No. 10-2017-0051486 filed on Apr. 21, 2017, in the Korean Intellectual Property Office, the disclosure of which is incorporated by reference herein in its entirety.

TECHNICAL FIELD

Various embodiments of the present disclosure relate to an electronic device including a waterproof structure.

BACKGROUND

The above information is presented as background information only to assist with an understanding of the present disclosure. No determination has been made, and no assertion is made, as to whether any of the above might be applicable as prior art with regard to the present disclosure.

As functional differences have been considerably reduced among electronic devices of respective manufacturers, in order to satisfy the purchase intension of consumers, electronic devices are gradually becoming slimmed, and are being developed to have increased rigidity to enhance a design aspect thereof as well as to differentiate functional elements thereof.

Among the functional factors of electronic devices, a waterproof function may be very important for portable electronic devices which are miniaturized and commonly carried by users. An electronic device may include at least one seal member disposed therein for waterproof, antifouling, or dustproof. The seal member may be applied in consideration of an effective arrangement relationship with other components within the electronic device.

SUMMARY

An electronic device may include at least one seal member disposed therein for a waterproof, antifouling, or dustproof function (hereinafter, referred to as a "waterproof function"). According to one embodiment, the seal member may be interposed between at least two housings (e.g., a bracket, a housing, a display module, etc.) included in the electronic device, and when the corresponding housings are coupled to each other, the seal member may implement the waterproof function in a manner of sealing the inner space of the electronic device.

An electronic device may include a display having a window and a display panel stacked on the rear face of the window, and a housing in which the window is disposed. According to one embodiment, the seal member is capable of implementing the waterproof function by being disposed between at least a partial region of the display panel and the housing, and of contributing to the slimming of the electronic device by preventing a Black Mask (BM) region (e.g., a bezel region, etc.) of the display from expanding.

As described above, when the seal member is disposed between the inner components (e.g., the display panel) of the electronic device and the housing, the seal member may be divided into a plurality of pieces and attached to the housing due to a step between the window and the display. Even though waterproof is implemented, when moisture infiltrates through gaps between the divided pieces of the seal member and remains in that state for a long period of time, peripheral components exposed to the moisture for a long period of time may suffer from performance degradation. According to one embodiment, a separate waterproof filler may be applied to the step space between the window and the display. However, due to the type of the display panel applied to the display or the assembly tolerance due to the cumulative assembly of respective component layers (e.g., an adhesive layer, a touch sensor, a display panel, or sub-material layer) of the display, or a manufacturing tolerance of each layer, a reverse step may occur in at least a part of an end region of the display (e.g., a stepped boundary region between the display and the window) in the stacked direction. When the waterproof filler is filled in the corresponding region, the reverse step section may not be filled up, whereby moisture may permeate therethrough.

According to various embodiments of the present disclosure, it is possible to provide an electronic device including a waterproof structure.

According to various embodiments, it is possible to provide an electronic device including: a housing including a first face, a second face that faces a direction opposite the first face, and a side face that encloses a space between the first face and the second face; a front plate disposed on the first face of the housing; a display disposed between at least a partial region of the front plate and the first face, and having a first layer and a second layer which are sequentially stacked; at least one first seal member disposed between an edge portion of the display and the first face of the display; at least one second seal member disposed between an edge portion of the front plate and the first face; and a waterproof filler applied to fill a step region formed between the first seal member and the second seal member due to a thickness of the display. The first layer and the second layer are disposed such that the first layer is closer to the front plate than the second layer, and when a rear face of the front plate is viewed from above, a part of the first layer protrudes from the second layer in the step region.

According to various embodiments, it is possible to provide an electronic device including: a housing including a front plate, a rear plate spaced apart from the front plate and facing the front plate, and a side structure directly or indirectly connected to the front plate and the rear plate, wherein the front plate includes a first flat portion that faces in the first direction, and a first side surface portion extending to be curved from an edge of the first flat portion toward the rear plate, wherein the rear plate includes a second flat portion that faces in a second direction opposite to the first direction, and wherein, when the front plate is viewed from above, the first flat portion and the first side face portion together form a rectangular shape including a first edge portion extending in a third direction perpendicular to the first direction and having a first length, and a second edge portion extending in a fourth direction perpendicular to the first direction and the third direction and having a second length longer than the first length; a touch screen display that faces in the first direction and is exposed through the front plate, wherein the touch screen display includes multiple layers, a first layer, and a second layer, which are stacked each other, and the first layer and second layer are disposed such that the first layer is closer to the front plate than the second layer, and when the rear plate is viewed from above, a part of the first layer protrudes from the second layer in a region adjacent to a point where the first edge portion and the second edge portion meets each other; a filler formed in the region; and a processor electrically connected to the touch screen display.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 6A and 6B are views each illustrating a stacking relationship of displays according to various embodiments of the present disclosure;

DETAILED DESCRIPTION

Figure 1:
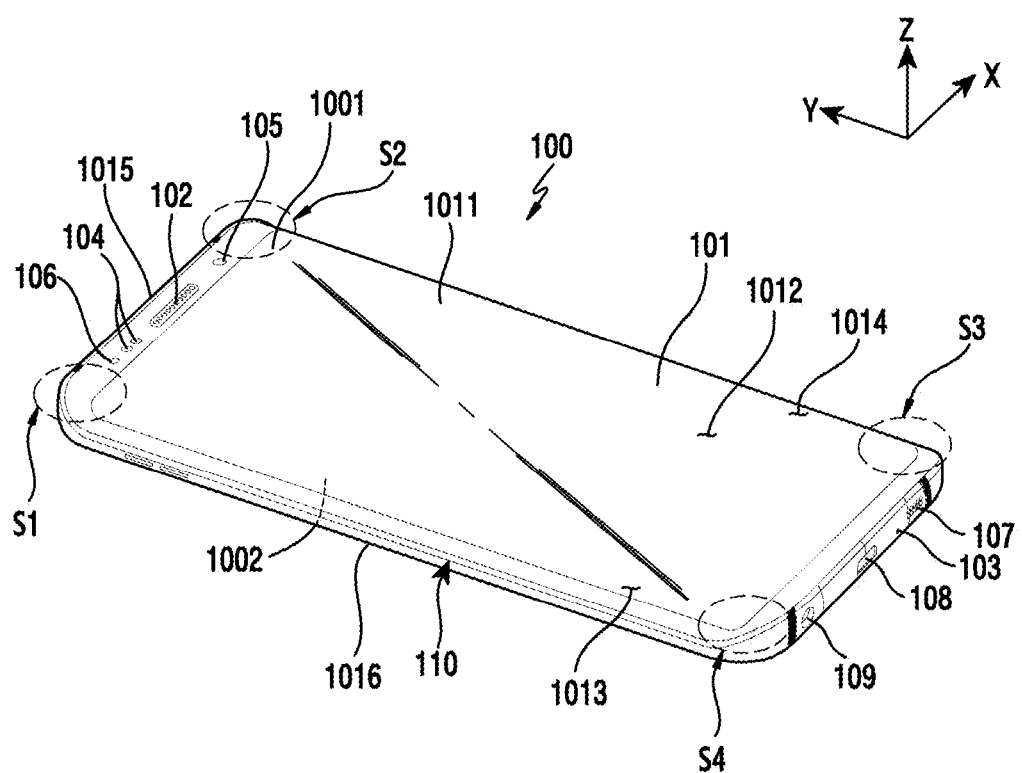
FIG. 1 illustrates a perspective view of a front side of an electronic device according to various embodiments of the present disclosure.

FIGS. 1 through 9B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Embodiments of the present disclosure will now be described in greater detail with reference to the accompanying drawings, in which similar reference numerals may be used to refer to similar elements. In the following disclosure, specific details such as detailed configuration and components are merely provided to aid in the overall understanding of these example embodiments of the present disclosure. Therefore, it should be apparent to those skilled in the art that various changes and modifications of the embodiments described herein can be made without departing from the scope and spirit of the present disclosure. For example, those skilled in the art will understand that the principles of the present disclosure may be implemented in any suitably arranged electronic device.

In addition, descriptions of well-known functions and constructions may be omitted for clarity and conciseness.

The terms and words used in the following description and claims are not limited to their dictionary meanings, but are used to convey a clear and consistent understanding of the present disclosure. Accordingly, it should be apparent to those skilled in the art that the following description of embodiments of the present disclosure is provided for illustrative purposes only and not for the purpose of limiting the present disclosure, as defined by the appended claims and their equivalents.

Singular terms such as "a," "an," and "the" include plural references unless the context clearly dictates otherwise. Thus, for example, "a component surface" includes reference to one or more of such surfaces.

Herein, terms such as "have," "may have," "include," and "may include" refer to the presence of corresponding features (e.g., elements such as numerical values, functions, operations, or parts), but do not preclude the presence of additional features.

The terms "A or B," "at least one of A or/and B," and "one or more of A or/and B" include all possible combinations of the enumerated items. For example, "A or B," "at least one of A and B," or "at least one of A or B" means (1) at least one A, (2) at least one B, or (3) at least one A and at least one B.

Numerical terms, such as "first" and "second", may be used to identify various elements regardless of an order and/or importance of the elements, and do not limit the elements. These terms may be used for the purpose of distinguishing one element from another element. For example, a first user device and a second user device may indicate different user devices, regardless of the order or importance the devices. Accordingly, a first element may be referred to as a second element, and similarly, a second element may be referred to as a first element, without departing from the scope the present disclosure.

When an element (e.g., a first element) is "(operatively or communicatively) coupled with/to" or "connected to" another element (e.g., a second element), the first element may be directly "coupled with/to" the second element, or there may be an intervening element (e.g., a third element) between the first element and the second element. However, when the first element is "directly coupled with/to" or "directly connected to" the second element, there is no intervening element therebetween.

Herein, the term "module" may refer, for example, to a unit including one of hardware, software, and firmware, or any combination thereof. The term "module" may be interchangeably used with terms, such as unit, logic, logical block, component, and circuit. A module may be a minimum unit of an integrally constituted component or may be a part thereof. A module may be a minimum unit for performing one or more functions or may be a part thereof. A module may be mechanically or electrically implemented. For example, a module may include, without limitation, at least one of a dedicated processor, a central processing unit (CPU), an application-specific integrated circuit (ASIC) chip, a field-programmable gate array (FPGA), and a programmable-logic device, or the like, which are known or will be developed and which perform certain operations.

All of the terms used herein, including technical or scientific terms, have the same meanings as those generally understood by a person having ordinary skill in the related art unless they are defined otherwise. Terms defined in a generally used dictionary should be interpreted as having the same or similar meanings as the contextual meanings of the relevant technology and should not be interpreted as having ideal or exaggerated meanings unless clearly defined as such herein. Even where terms are defined in the disclosure, the terms should not be interpreted as excluding embodiments of the present disclosure.

Example electronic devices may include smart phones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, and/or wearable devices, or the like, but are not limited thereto. For example, the wearable devices may include accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), and/or implantable wearable devices (e.g., implantable circuits), or the like, but are not limited thereto.

The electronic devices may include smart home appliances, such as televisions (TVs), digital versatile disk (DVD) players, audio players, refrigerators, air conditioners, cleaners, ovens, microwave ovens, washing machines, air cleaners, set-top boxes, home automation control panels, security control panels, TV boxes (e.g., SAMSUNG HOMESYNC, APPLE TV, or GOOGLE TV), game consoles (e.g., XBOX and PLAYSTATION), electronic dictionaries, electronic keys, camcorders, and/or electronic picture frames, or the like, but are not limited thereto.

The electronic devices may include a medical device, such as a portable medical measurement device (e.g., a blood glucose meter, a heart rate monitor, a blood pressure monitor, or a thermometer), a magnetic resonance angiography (MRA) device, a magnetic resonance imaging (MM) device, a computed tomography (CT) device, a scanner, an ultrasonic device, a navigation device, a GPS receiver, an event data recorder (EDR), a flight data recorder (FDR), a vehicle infotainment device, electronic equipment for a vessel (e.g., navigation systems, gyrocompasses, etc.), an avionic device, a security device, a head unit for a vehicle, an industrial or home robot, an automatic teller machine (ATM), a point of sale (POS) device, and/or an Internet of Things (IoT) device (e.g., a light bulb, sensor, electric or gas meter, sprinkler device, fire alarm, thermostat, street lamp, toaster, exercise equipment, hot water tank, heater, or boiler), or the like, but are not limited thereto. The electronic device may also include a part of furniture or building/structure, electronic board, electronic signature receiving device, projector, or measuring instrument (e.g., water meter, electricity meter, gas meter, or wave meter), or the like, but is not limited thereto. The electronic device may be a flexible electronic device. The electronic device may be a combination of the above-described devices. Additionally, the electronic device of the present disclosure is not limited to the above-described devices, and may include a new electronic device according to the development of new technologies. Herein, the term "user" may refer to a person who uses an electronic device or may refer to a device (e.g., an artificial intelligence (AI) electronic device) which uses an electronic device.

While according an exemplary embodiment of the present disclosure, a bar type electronic device is illustrated in the drawings and a waterproof structure applied thereto is described below, the present disclosure is not limited thereto. For example, such a waterproof structure may be applied to a folder-type electronic device, a slide-type electronic device, a flexible-type electronic device, or a wearable-type electronic device, which include a display and require a waterproof structure.

Figure 2:
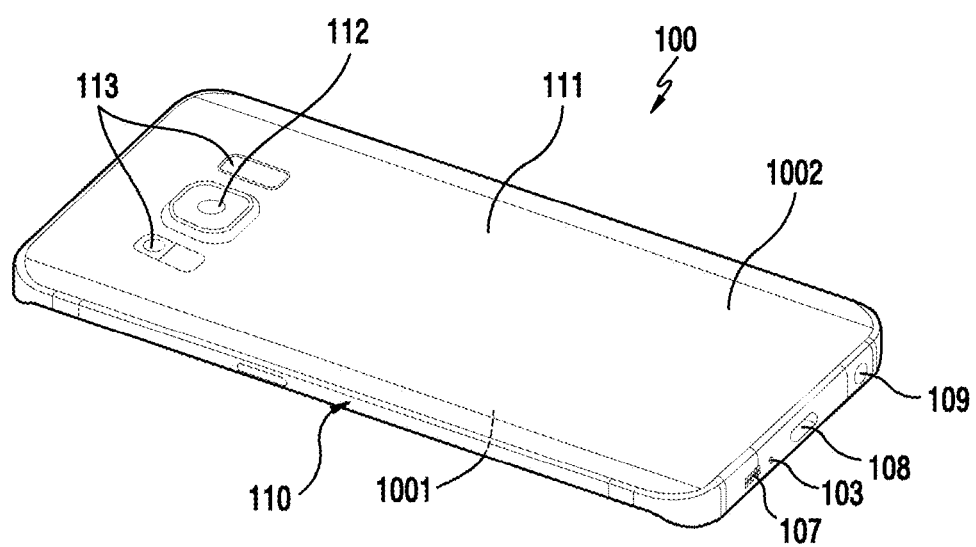
FIG. 2 illustrates a perspective view of a rear side of the electronic device according to various embodiments.

FIG. 1 illustrates a perspective view of a front side of an electronic device according to various embodiments of the present disclosure. FIG. 2 illustrates a perspective view of a rear side of the electronic device according to various embodiments.

Referring to FIGS. 1 and 2, an electronic device 100 may include a housing 110. According to one embodiment, the housing 110 may be formed of a conductive member and/or a non-conductive member. According to one embodiment, the electronic device 100 may have a display 101 (e.g., a touch screen display) disposed on a first face 1001 (e.g., a front face or a top face) thereof that faces in a first direction (e.g., a Z-axis direction) and including a front plate 1011

(e.g., a window or a glass plate). According to one embodiment, the front plate 1011 may include a first flat portion 1012 that faces in a first direction and a first side face portion 1013 that extends to be bent from the first flat portion 1012 toward a rear plate 111 (e.g., in a −Z-axis direction). According to one embodiment, the front plate 1011 may include a second side face portion 1014 that extends to be bent from a position, which is opposite the first side face portion 1013 with respect to the first flat portion 1012, toward the rear plate 111 (e.g., in the −Z-axis direction).

According to various embodiments, the electronic device 100 may include a receiver 102 disposed in the housing 110 so as to output the voice of a called party. According to one embodiment, the electronic device 100 may include a microphone device 103, which is disposed in the housing 110 so as to transmit the user's voice to the communication partner. According to one embodiment, the electronic device 100 may include at least one key input device, which is disposed in the housing 110. According to one embodiment, the key input device may include at least one side key button, which is disposed on a side face of the housing 110. According to one embodiment, the at least one side key button may include a volume control button, a wake-up button, or a button to execute a specific function (e.g., an Artificial Intelligence (AI) execution function or a rapid voice recognition execution mode entry function, etc.).

According to various embodiments, the electronic device 100 may include components, which are disposed in the manner of being exposed in the display 101, or in the manner of performing functions through the window but not being exposed, in order to perform various functions of the electronic device 100. According to one embodiment, the components may include at least one sensor module 104. The sensor module 104 may include, for example, an illuminance sensor (e.g., an optical sensor), a proximity sensor (e.g., an optical sensor), an infrared sensor, an ultrasonic sensor, a fingerprint recognition sensor, a face recognition sensor, or an iris recognition sensor. According to one embodiment, the components may include a camera device 105. According to one embodiment, the components may include an indicator 106 (e.g., an LED device) for visually providing status information of the electronic device to the user. According to one embodiment, at least one of these components may be disposed to be exposed through at least a partial region of a second face 1002 (e.g., a rear face or back face) that faces in a second direction (e.g., −Z-axis direction) opposite the first direction of the electronic device 100.

According to various embodiments, the electronic device 100 may include a speaker device 107. According to one embodiment, the electronic device 100 may include an interface connector port 108 configured to receive a data transmission/reception function and external power applied thereto by an external device so as to charge the electronic device 100. According to one embodiment, the electronic device 100 may include an earphone jack assembly 109.

According to various embodiments, the electronic device 100 may include a rear plate 111 (e.g., a rear window or a rear cover) disposed on the second face 1002. According to one embodiment, a rear camera device 112 may be disposed on the rear plate 111, and one or more electronic components 113 may be disposed around the rear camera device 112. According to one embodiment, the electronic components 113 may include at least one of, for example, an illuminance sensor (e.g., an optical sensor), a proximity sensor (e.g., an optical sensor), an infrared sensor, an ultrasonic sensor, a heart rate sensor, a fingerprint recognition sensor, and a flash device.

According to various embodiments, the display 101 may include a front plate (e.g., a front plate 321 of FIG. 3) disposed to be exposed on the first face 1001 of electronic device 100. According to one embodiment, the display 101 may include a display panel (e.g., a display panel 3222 of FIG. 3) that is stacked on the rear face (e.g., a rear face 3212 of FIG. 3) of the front plate. According to one embodiment, an image displayed through the display panel may be provided to the user through the front plate that is made of a transparent material. According to one embodiment, the front plate may be made using various materials such as transparent glass and acryl, etc.

According to various embodiments, the electronic device 100 may include a waterproof structure. According to one embodiment, the electronic device 100 may include at least one seal member (e.g., seal members 330 and 380 of FIG. 3) disposed therein for waterproof. According to one embodiment, the at least one seal member may be disposed between the display 101 and the housing 110 at least in the region where the display panel (e.g., the display panel 3222 of FIG. 3) of the display 101 is disposed. According to one embodiment, since the space for disposing the sealing member between the front plate and the housing 110 is eliminated by the structure in which the at least one sealing member is disposed between the display 101 and the housing 110, the BM region can be reduced or eliminated in the BM region in the display region of the electronic device 100.

According to various embodiments, the at least one seal member may be divided into and disposed as a plurality of seal members by a step between the rear face (e.g., the rear face 3212 of FIG. 3) of the front plate (e.g., the front plate 321 of FIG. 3) and the display 101 region. According to one embodiment, a waterproof structure may be additionally formed in the spaces (generally stepped regions) between the plurality of seal members by a separate waterproof filler. In this case, respective component layers disposed in the edge portions of the display to which a waterproof filler is applied may be disposed such that, when the rear plate is viewed from above, at least a part of a lower component layer in a stacked direction protrudes from a component layer disposed thereon.

According to various embodiments, the front plate 1011 may include a first peripheral portion 1015 extending in a third direction (e.g., the X-axis direction) perpendicular to the first direction and having a first length, and a second peripheral portion 1016 extending in a fourth direction (e.g., the Y-axis direction) perpendicular to the first direction and the third direction and having a second length longer than the first length. According to one embodiment, the relatively protruding portion of each of the component layers of the display 101 may be disposed in a region S1 that is a near region of a point where the first peripheral portion 1015 and the second peripheral portion 1016 meet with each other. According to one embodiment, such a protruding portion may also be disposed in each of regions S2, S3, and S4 which are similar to the region S1.

Figure 3:
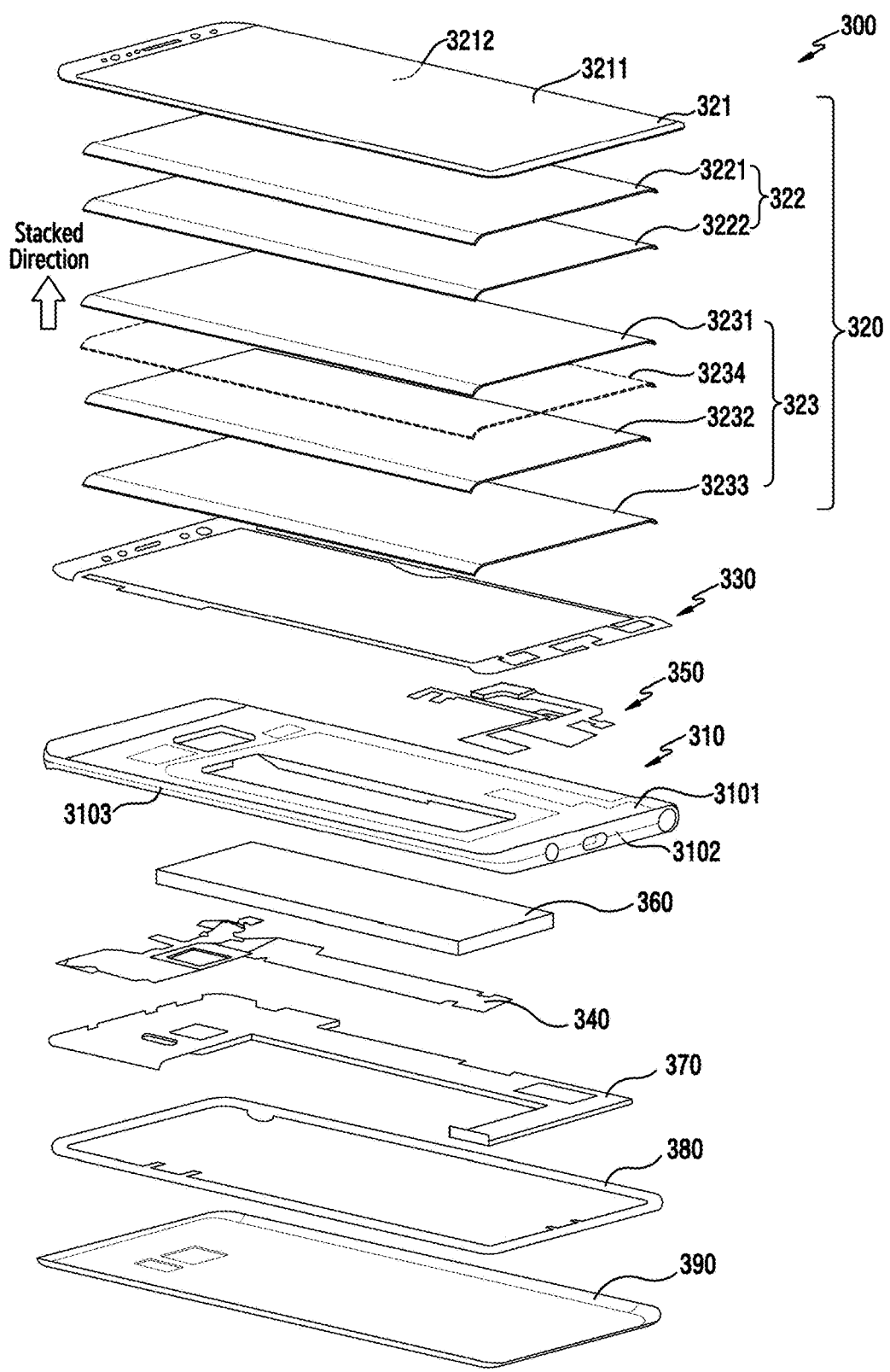
FIG. 3 illustrates an exploded perspective view of an electronic device according to various embodiments of the present disclosure.

FIG. 3 illustrates an exploded perspective view of an electronic device according to various embodiments of the present disclosure.

The electronic device 300 of FIG. 3 may be similar to the electronic device 100 of FIG. 1, or may include another embodiment of the electronic device.

Referring to FIG. 3, the electronic device 300 may include a housing 310 (e.g., the housing 110 of FIG. 1) (e.g., a side structure). According to one embodiment, the housing 310 may have a first face 3101 that faces in the first direction (e.g., the Z axis direction in FIG. 1), a second face 3102 that faces in a second direction (e.g., the −Z direction in FIG. 1 to be opposite the first face 3101), and a side face 3103 that surrounds the first face 3101 and the second face 3102 and provides a thickness of the housing 310.

According to various embodiments, the electronic device 300 may include a display 320 (e.g., a touch screen display) in which a key input circuit 350, at least one seal member 330, and a front plate 321 (e.g., the window or the glass plate) are sequentially disposed on the first face 3101 of the housing 310. According to one embodiment, the electronic device 300 may include a board 340 (e.g., PCB, FPCB, etc.), a battery 360, an intermediate housing 370 (e.g., a bracket or a rear housing), a rear seal member 380, and a rear plate (e.g., a rear cover or a rear window) which are sequentially disposed on the second face 3102 of the housing 310.

According to various embodiments, the electronic device 300 may further include a wireless power transmission/reception member (not illustrated). According to one embodiment, the electronic device 300 may further include a detection member 3234 configured to detect an electronic pen applied as a data input means. According to one embodiment, the detection member 3234 may include an Electro-Magnetic Resonance (EMR) sensor pad (e.g., a digitizer) that operates in an electromagnetic induction manner in order to receive a feedback signal by a resonance frequency of a coil provided in the electronic pen.

According to various embodiments, the battery 360 may be accommodated in an accommodation space formed in at least a partial region of the housing 310, and may be disposed while avoiding the board 340. According to one embodiment, the battery 360 and the board 340 may be disposed parallel to each other without overlapping each other. According to one embodiment, the key input circuit 350 may be disposed in the first direction of the housing 310. According to one embodiment, the key input circuit 350 may include a force sensor circuit (e.g., a pressure detection circuit) that detects the pressure input from the front plate 321.

According to various embodiments, the front plate 321 may have a front face 3211 that faces in the first direction (e.g., the Z-axis direction in FIG. 1) of the electronic device and a rear face 3212 that faces in the second direction (e.g., the −Z-axis direction in FIG. 1) to be opposite the front face 3211. According to various embodiments, the display 320 includes multiple layers 322 disposed on the rear face 3212 of the front plate 321 and at least one subsidiary material layer 323 stacked on the multiple layers 322. According to one embodiment, the multiple layers 322 may include a touch sensor 3221 (e.g., a touch panel) and a display panel 3222. According to one embodiment, the touch sensor may be disposed between the display panel 3222 and the front plate 321. According to one embodiment, the display panel 3222 and the touch sensor 3221 may be attached to the rear face 3212 of the front plate 321 through an adhesive member. According to one embodiment, the adhesive member may include OCA or PSA.

According to various embodiments, the subsidiary material layer 323, which is stacked on the multiple layers 322, may include a polymer member 3231, a functional member 3232, or a conductive member 3233. According to one embodiment, the polymer member 3231 may be attached to the rear face of the display panel 3222 using an adhesive member (e.g., OCA, PSA, conventional adhesive, tape, or bonding and thermally reactive adhesive), and may perform a shock-absorption action. According to one embodiment, a dark color (e.g., black) may be applied to the polymer member 3231 so as to help displaying the background when the display is turned off. According to one embodiment, the functional member 3232 may include an added display, a force touch FPCB, a fingerprint sensor FPCB, a communication antenna radiator, a heat dissipation sheet, a conductive/non-conductive tape, an open cell sponge, or a graphite sheet for heat dissipation. According to one embodiment, the conductive member 3233 may include a metallic member for shielding noise and for dispersing heat emitted from peripheral heat-emitting components. According to one embodiment, the metallic member may include copper (Cu). According to one embodiment, the above-described electronic pen detection member 3234 or a wireless power transmission/reception member (e.g., a coil member) may be interposed between the components of the subsidiary material layer 323.

According to various embodiments, the display 320 may be attached to the first face 3101 of the housing 310 by a seal member 330. According to one embodiment, the seal member 330 may be divided into a plurality of unit seal members with respect to a stepped region between the display 320 and the rear face 3212 of the front plate 321, and may be attached generally along the peripheral edge of the display 320 and the peripheral edge of the rear face 3212 of the front plate 321. According to one embodiment, the rear plate 390 may have a closed loop shape and may be attached by the rear seal member 380 disposed along the peripheral edge of the second face 3102 of the housing 310. According to one embodiment, the seal member 330 and the rear seal member 380 may include at least one of tape, adhesive, waterproof dispensing, silicon, waterproof rubber, and urethane.

Figure 4A:
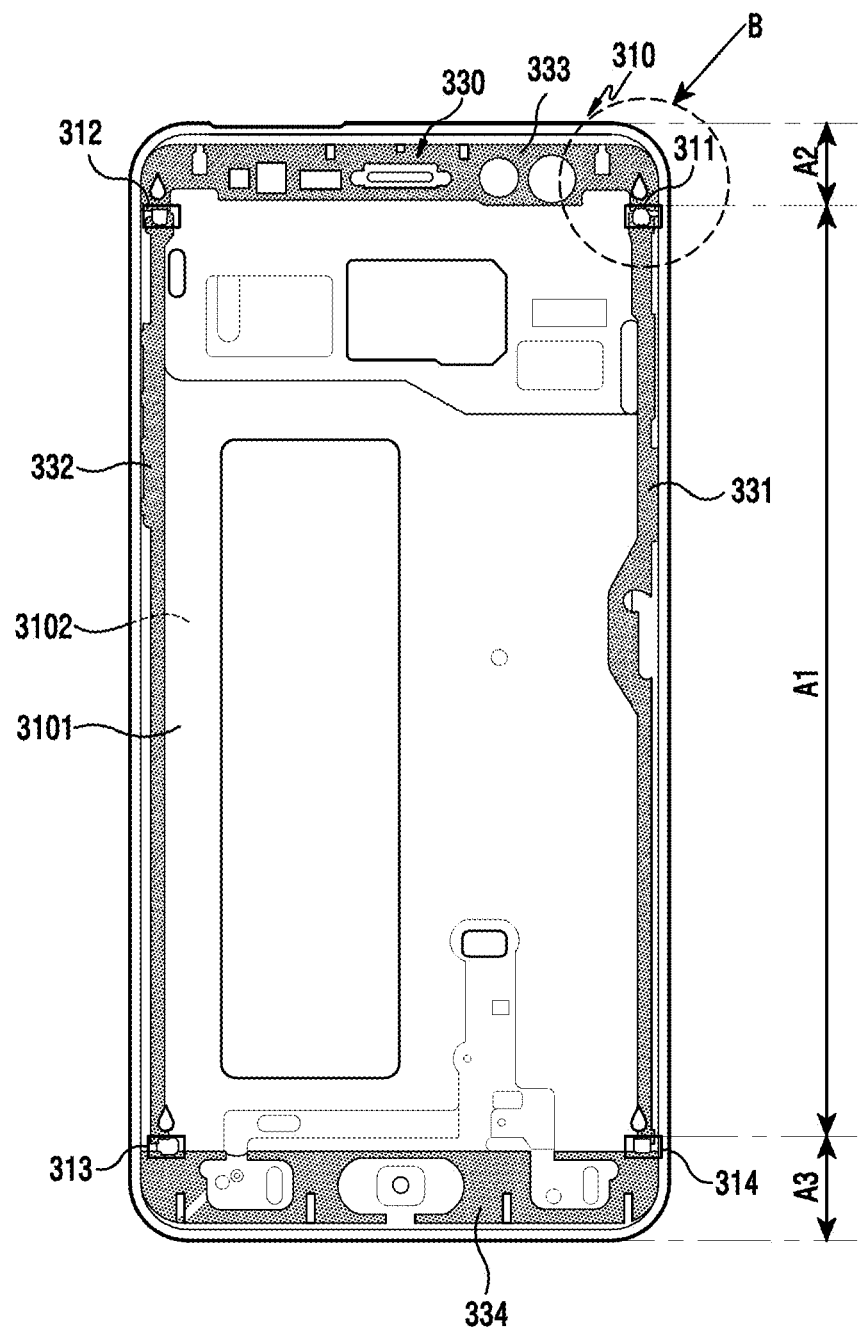
FIGS. 4A to 4C are views each illustrating a state in which a waterproof filler is applied to a housing according to various embodiments of the present disclosure.
Figure 4B:
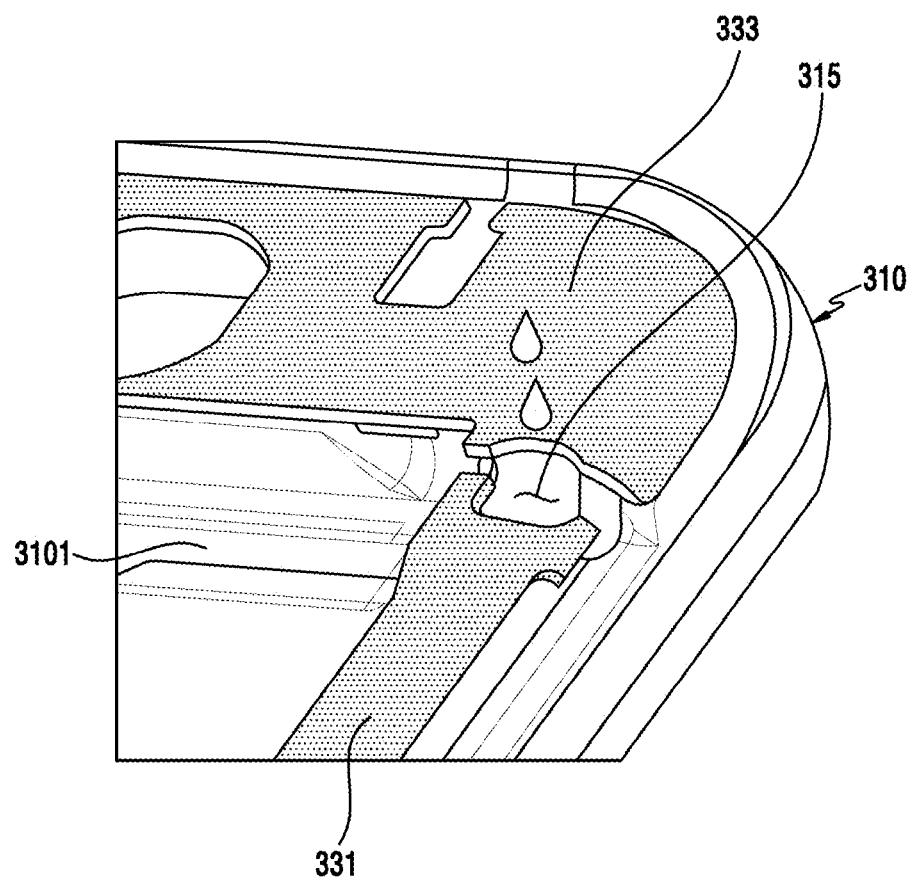
Figure 4C:
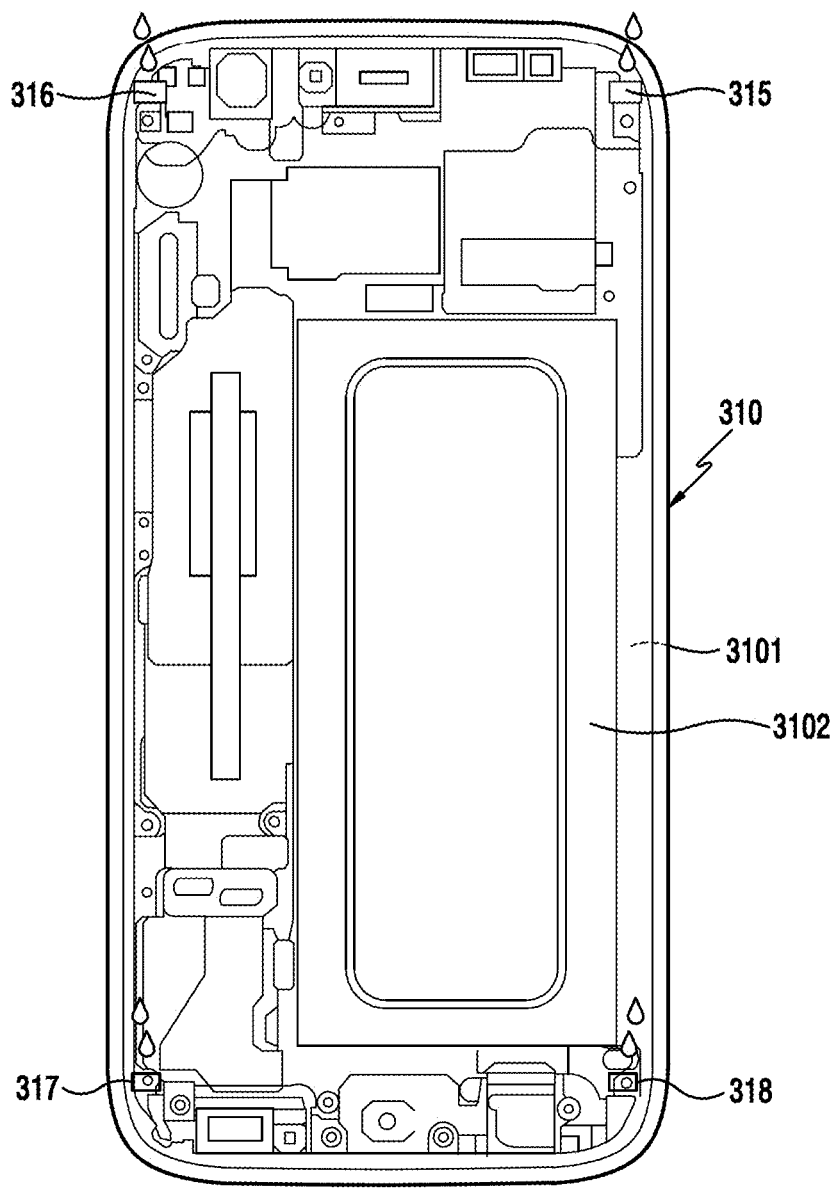

FIGS. 4A to 4C are views each illustrating a state in which a waterproof filler is applied to a housing according to various embodiments of the present disclosure. FIG. 4B is a perspective view illustrating a main portion in which a region B in FIG. 4A is illustrated in an enlarged scale.

Referring to FIGS. 4A to 4C, the housing 310 may include a seal member 330 attached along the peripheral edge thereof. According to one embodiment, the seal member 330 may include a plurality of unit seal members. According to one embodiment, the seal member 330 may include, along the longitudinal direction of the housing 310, an attachment region (a region A1) of the display (e.g., the display 320 of FIG. 3) and front plate attachment regions (a region A2 and a region A3) disposed above and below the display attachment region (region A1). According to one embodiment, the seal member 330 may include a plurality of seal members divisionally attached in order to prevent the adhesiveness from deteriorating by the stepped region between the rear face (e.g., the rear face 3212 of FIG. 3) of the front plate (e.g., the front plate 321 of FIG. 3) and the display disposed on the rear face of the front plate.

According to various embodiments, the seal member 330 may include a first seal member 331, a second seal member 332, a third seal member 333, and a fourth seal member 334. According to one embodiment, the first seal member 331 and the second seal member 332 may be disposed in an attachment region (the region A1) of the housing 310 to which the display (e.g., the display 320 of FIG. 3) is attached. According to one embodiment, the third seal member 333 and the fourth seal member 334 may be disposed in the attachment regions (the region A2 and the region A3) of the housing 310 to which the front plate (e.g., the front plate 321 of FIG. 3) is attached. According to one embodiment, the seal member 330 may include at least one of tape, adhesive, waterproof dispensing, silicon, waterproof rubber, and urethane.

According to various embodiments, in the housing 310 having the seal member 330 attached thereto, a stepped region (e.g., a gap) may occur due to a height difference between the rear face (e.g., the rear face 3212 in FIG. 3) of the front plate (e.g., the front plate 321 in FIG. 3) and the display (e.g., the display 320 in FIG. 3). According to one embodiment, the stepped regions may include a boundary region 311 between the first seal member 331 and the third seal member 333, a boundary region 314 between the first seal member 331 and the fourth seal member 334, a boundary region 312 between the second seal member 332 and the third seal member 333, and a boundary region 313 between the second seal member 332 and the fourth seal member 334. According to one embodiment, these stepped regions 311, 312, 313, and 314 are portions vulnerable to infiltration of moisture, and a separate waterproof filler (e.g., the waterproof filler 319 of FIG. 5) may be additionally applied such that the general inner region of the housing 310 may have a sealed region in which moisture infiltrating into the inner region from the outside is blocked by the seal member 330 and the waterproof filler.

According to various embodiments, a waterproof filler (e.g., a waterproof filler 319 of FIG. 5) may be introduced through each of filler introduction holes 315, 316, 317, and 318, which are formed from the second face 3102 to the first face 3101 of the housing 310 at positions where the filler introduction holes 315, 316, 317, and 318 overlap the stepped regions 311, 312, 313, and 314 formed by the plurality of unit seal members 331, 332, 333, and 334 of the housing 310. According to one embodiment, the waterproof filler 319 may be introduced from the second face 3102 toward the first face 3101 of the housing through each of the filler introduction holes 315, 316, 317, and 318 formed in the stepped regions 311, 312, 313, and 314 of the housing 310. According to one embodiment, the waterproof filling member 319 may include a semisolid material or a liquid material, and may be solidified by a natural or external condition (e.g., heat, ultraviolet rays, pressure, or the like).

According to various embodiments, a waterproof filler structure may be implemented, for example, by introducing the waterproof filler (e.g., the waterproof filler 319 of FIG. 5) through each of the filler introduction holes 315, 316, 317, and 318 from the second face 3102 of the housing 310 after the display (e.g., the display 320 of FIG. 3) including the multiple layers 322 (e.g., the multiple layers 323 in FIG. 3) and the subsidiary material layer (e.g., the subsidiary material layer 323 of FIG. 3), which are sequentially stacked on the rear face (e.g., the rear face 3212 in FIG. 3) of the front plate (e.g., the front plate 321 in FIG. 3) is attached to the first face 3101 of the housing 310 by the seal members 330 (e.g., the first seal member 331, the second seal member 332, the third seal member 333, and the fourth seal member). However, the present disclosure is not limited thereto, and before the front plate 321 is attached to the first face 3101 of the housing 310, the waterproof filler 319 may be applied to each of the above-mentioned stepped regions 311, 312, 313, and 314 of the housing 310 first, and then the front plate 321 including the display 320 may be attached by the seal members 330.

According to various embodiments, in the electronic device (e.g., the electronic device 300 of FIG. 3), a stable waterproof function can be implemented as a closed space is provided between display 320 and the housing 310 by a closed-curve loop, which does not have a discontinuous section and is formed through the multiple seal members 331, 332, 333, and 334 and the waterproof filler (e.g., the waterproof filler 319 of FIG. 5).

According to various embodiments, each of the above-described component layers of the display (e.g., the display 320 of FIG. 3) may be disposed such that the edge regions of the component layers coincide with each other or the component layers have a normal step structure in the stacked order from the rear face (e.g., the rear face 3212 of FIG. 3) of the front plate (e.g., the front plate 321 of FIG. 3). The waterproof filler provided on the second face 3102 of the housing 310 toward the first face 3101 can be closely packed without a void, so that a stable waterproof function can be implemented. That is, when the rear face (e.g., the rear face 3212 in FIG. 3) of the front plate is viewed from above, the plurality of component layers may be sequentially disposed such that at least a part of a component layer stacked below each component layer protrudes.

Figure 5A:
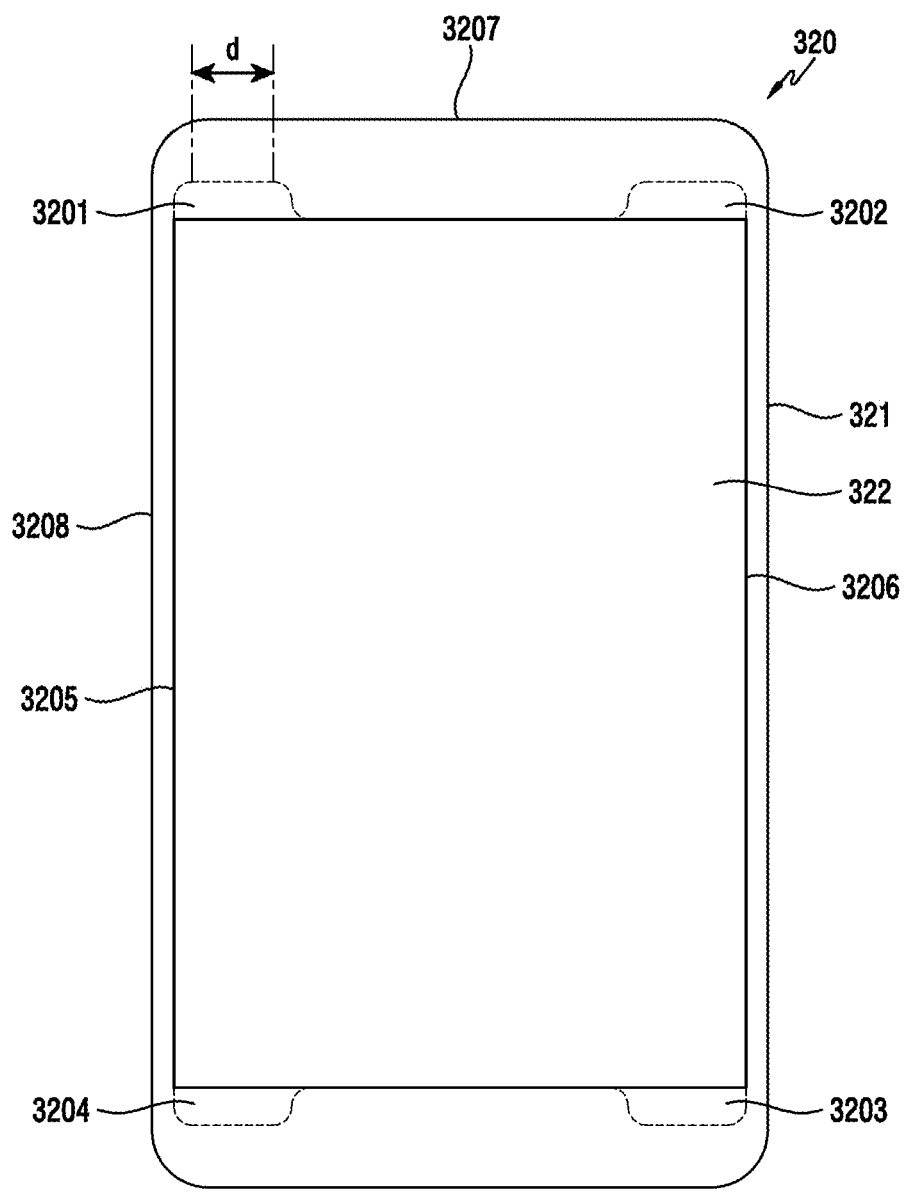
FIG. 5A illustrates a schematic view of a configuration of a display according to various embodiments of the present disclosure.
Figure 5B:
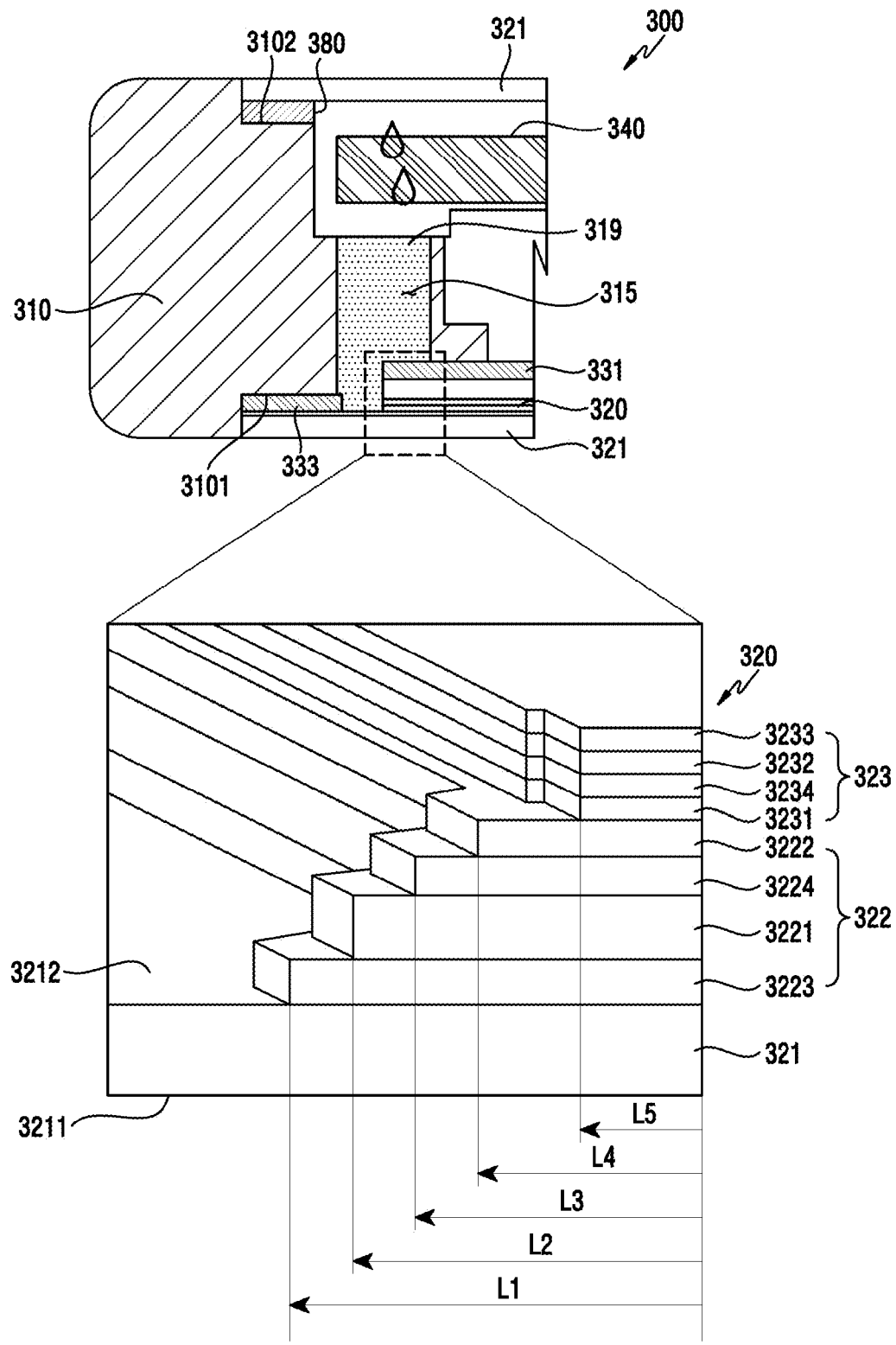
FIG. 5B illustrates a cross-sectional view of a main portion of an electronic device to which a waterproof filler according to various embodiments of the present disclosure is applied.

FIG. 5A illustrates a schematic view of a configuration of a display according to various embodiments of the present disclosure. FIG. 5B illustrates a cross-sectional view of a main portion of an electronic device to which a waterproof filler according to various embodiments of the present disclosure is applied.

Referring to FIG. 5A, the display 320 may include a front plate 321 and multiple layers 322 stacked on the front plate 321. According to one embodiment, the multiple layers 322 may include a touch sensor (e.g., the touch sensor 3221 of FIG. 3) and a display panel (e.g., the display panel 3222 of FIG. 3) sequentially stacked on the rear face of the front plate 321. According to one embodiment, the multiple layers 322 may include one or more stacked regions 3201, 3202, 3203, and 3204 each protruding from an arrangement region of the multiple layers 322 to a space provided in the front plate 321. According to one embodiment, the stacked regions 3201, 3202, 3203, and 3204 may be configured such that the display panel (e.g., the display panel 3222 of FIG. 3) does not protrude to the stacked regions, but remaining component layers other than the display panel may protrude using at least a part of the above stacked regions 3201, 3202, 3203, and 3204. However, the present disclosure is not limited thereto, and at least a part of the display panel (e.g., the display panel 3222 of FIG. 3) may also protrude into at least a part of the above-described stacked regions 3201, 3202, 3203, and 3204. According to one embodiment, in the stacked region, respective component layers (e.g., a touch sensor and a display panel) of the multiple layers 322 may be disposed such that, when the rear face of the front plate 321 is viewed from above, at least a part of a lower component layer (e.g., the touch sensor) protrudes relative to a component layer (e.g., the display panel) disposed thereon.

According to various embodiments, the display 320 may include the multiple layers 322 including a display panel (e.g., the display panel 3222 of FIG. 3), and the left and right edge portions of the front plate 321 may include curved regions 3205 and 3206 (e.g., the first side face portion 1013 and the second side face portion 1014 of FIG. 1). According to one embodiment, seal members (e.g., the first seal member 331 and the second seal member 332 of FIG. 4A) may be disposed between the display 320 and the housing (e.g., the housing 310 in FIG. 3) in order to reduce the BM of the display 320 disposed in such curved regions 3205 and 3206. With this arrangement, the waterproof structure is implemented, but at least the curved regions of the display 320 may be exposed to moisture up to the side faces of the display 320. For example, a first peripheral portion 3207 of the illustrated display 320 may include a seal member (e.g., the third seal member 333 of FIG. 4A) disposed between the front plate 321 and the housing (e.g., the housing 310 of FIG. 3), thereby allowing a complete waterproof section through which no moisture permeates. On the contrary, a second peripheral portion 3208 may have a configuration in which a part of the display 320 is exposed to moisture due to the reduction of BM of the curved region 3205 described above. Accordingly, due to the stepped structure by the thickness of the display 320, a waterproof filler (e.g., the waterproof filler 319 in FIG. 5B) may be applied to a region 3201 where the first peripheral portion 3207 and the second peripheral portion 3208 meet. According to one embodiment, it may be effective that the waterproof filler 319 is applied to the first peripheral portion 3207 having a complete waterproof structure rather than to the second peripheral portion 3208 in which some moisture is exposed in the above-described region 3201. According to one embodiment, the waterproof filler 319 may be applied to a straight-line section d in the region in which the first peripheral portion 3207 meets the second peripheral portion 3208.

Referring to FIG. 5B, the electronic device 300 may include a housing, a front plate disposed on a first face of the housing, and a rear plate disposed on a second face of the housing. According to one embodiment, the housing 310 may include a filler introduction hole 315 formed from the second face 3102 to the first face 3101 in a boundary region between a display attachment region (e.g., the region A1 in FIG. 4A) and a front plate attachment region (e.g., the regions A2 and A3 in FIG. 4A). According to one embodiment, the housing 310 may have one or more seal members 331 and 333 attached to the first face 3101. According to one embodiment, the one or more seal members 331 and 333 include a first seal member 331 attached to a display disposition region (e.g., the region A1 in FIG. 4A) of the housing 310, and a third seal member 333 attached to the front plate attachment region (e.g., the regions A2, A3 in FIG. 4A) of the housing 310. According to one embodiment, the display 320 may be attached to or stacked on the rear face (e.g., the rear face 3212 of FIG. 3) of the front plate 321. According to one embodiment, the front plate 321, to which the display 320 is attached, may be attached to the first face 3101 of the housing 310 via the first seal member 331 and the third seal member 333. In this case, the first seal member 331 may be interposed between the display 320 and the housing 310, and the third seal member 333 may be interposed between the housing 310 and the front plate 321.

According to various embodiments, a waterproof filler 319 may be applied to the filler introduction hole 315 to compensate for the step generated due to the height (e.g., thickness) of the display 320. According to one embodiment, the waterproof filler 319 may be introduced from the second face 3102 of the housing 310 toward the first face 3101, and may be filled to include the edge region of the display 320.

According to various embodiments, the component layers of the display 320 may be disposed such that respective edge regions coincide with each other or have a normal step structure in the stacked direction from the rear face 3212 of the front plate 321. This is because, when the component layers are disposed to have inverted steps, the waterproof filler 319 is not sufficiently introduced into the inversely stepped region, and external moisture may permeate through this portion.

According to various embodiments, the touch sensor 3221, the display panel 3222, and the adhesive members 3223 and 3224, which are the multiple layers 322 of the display 320, may be disposed such that the edge regions thereof coincide with each other or to have a normal step structure in the stacked order from the rear face 3212 of the front plate 321. According to one embodiment, the multiple layers 322 may include the touch sensor 3221 attached to the rear face 3212 of the front plate 321 by the first adhesive member 3223, and the display panel 3222 stacked on the touch sensor 3221 by the second adhesive member 3224. According to one embodiment, the total length L1 of the first adhesive member 3223 may be equal to or longer than the total length L2 of the touch sensor 3221. According to one embodiment, the total length L2 of the touch sensor 3221 may be equal to or longer than the total length L3 of the second adhesive member 3224. According to one embodiment, the total length L3 of the second adhesive member 3224 may be equal to or longer than the total length L4 of the display panel 3222. For example, the area of the second adhesive member 3222 may be formed to be larger than the total area of the display panel 3222, the area of the touch sensor 3221 may be formed to be larger than the area of the second adhesive member 3224, and the area of the second adhesive member 3223 may be formed to be larger than the area of the touch sensor 3221 so as to be attached to the rear face 3212 of the front plate 321. Therefore, the first adhesive member 3223, the touch sensor 3221, the second adhesive member 3224, and the display panel 3222 may be stacked to have a normal step structure from the rear face 3212 of the front plate 321 in the waterproof filler introduction direction. That is, the first adhesive member 3223, the touch sensor 3221, the second adhesive member 3224, and the display panel 3222 are sequentially disposed such that, when the rear face 3212 of the front plate 321 is viewed from above, at least a part of a lower component layer protrudes relative to a component layer disposed thereon, so that uniform application of a viscous waterproof filler 319 can be induced. According to one embodiment, such protruding portions can be minimized to the region where the waterproof filler 319 is applied.

According to various embodiments, the polymer layer 3231, the electronic pen detection member 3234 (e.g., the digitizer), the functional member 3232, and the conductive member 3233 included in the subsidiary material layer 323 of the display 320 may also be disposed such that the edge regions thereof coincide with each other or have a normal step structure in the stacked order from the rear face of the front plate 321. That is, the polymer layer 3231, the electronic pen detection member 3234 (e.g., a digitizer), the functional member 3232, and the conductive member 3233 are sequentially disposed such that, when the rear face 3212 of the front plate 321 is viewed from above, at least a part of a lower component layer protrudes relative to a component layer disposed thereon, so that uniform application of a viscous waterproof filler 319 can be induced. For example, the subsidiary material layer 323 may also be stacked by an adhesive member (e.g., OCA, PSA, tape, or the like) for each component layer. In such a case, the total length L5 of the subsidiary material layer 323 may be equal to or shorter than the total length L4 of the display panel 3222 disposed to correspond thereto. According to one embodiment, as shown, each of the component layers of the subsidiary material layer 323 is stacked such that the edge portions thereof coincide with each other without a step, but the present disclosure is not limited thereto. For example, like the multiple layers 322 described above, respective component layers may be disposed such that at least a part of a lower component layer in the introduction direction of the waterproof filler 319 protrudes relative to a component layer disposed thereon.

In the related art, the respective component layers (e.g., the multiple layers 322 and the subsidiary material layer 323) of the display 320 may be disposed to form an inverse step structure in which, when the rear display 390 is viewed from above, a component layer protrudes relative to a component layer disposed therebelow, and a waterproof filler is not completely filled in the corresponding inverse step portion, which may cause infiltration of external moisture.

According to various embodiments of the present disclosure, at least some component layers among the respective component layers (e.g., the multiple layers 322 and the subsidiary material layer 323) of the display 320 are disposed to form a normal step structure in which, when the rear display 390 is viewed from above, at least a part of a lower component layer protrudes relative to a component layer disposed thereon, so that uniform application of a viscous waterproof filler can be guided in the step portion of each component layer, thereby implementing a stable waterproof function.

Figure 6B:
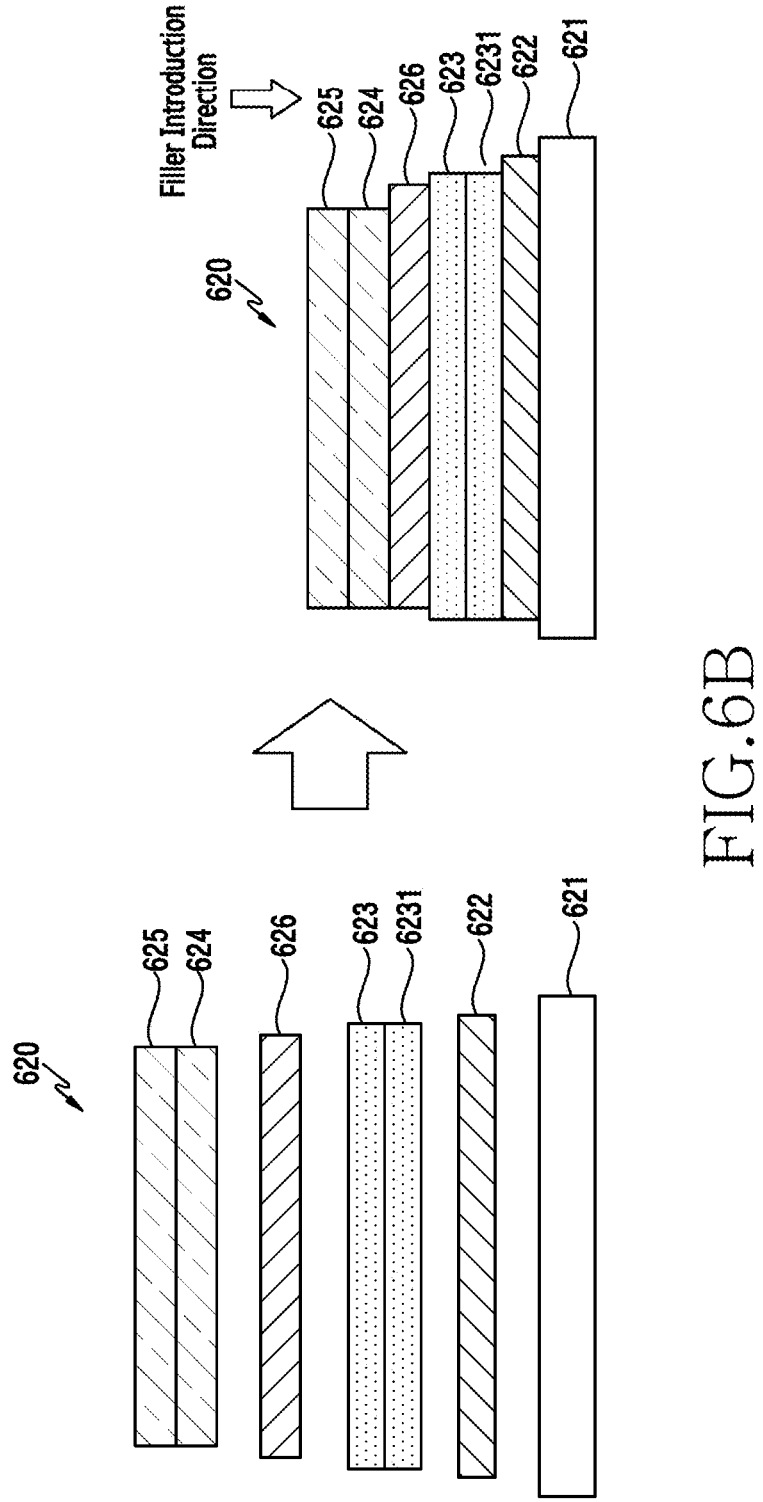

FIGS. 6A and 6B are views each illustrating a stacking relationship of displays according to various embodiments of the present disclosure.

A display 620 in FIGS. 6A and 6B may be similar to the display 101 of FIG. 1A or the display 320 of FIG. 3, or may include another embodiment of the display.

Referring to FIG. 6A, the display 620 may include multiple layers 622, a polymer member 623, an electronic pen detection member 626 (e.g., a digitizer), a functional member 624, and a conductive member 625, which are sequentially stacked on the rear face (e.g., the rear face 3212 in FIG. 3) of a front plate 621. According to one embodiment, respective component layers may be stacked on the front plate 621 in the state in which at least some of the layers assembled together. According to one embodiment, at least some of the layers may be cut or stamped into a desired size in the assembled state, or assembled layers, each of which is formed in a corresponding size, may be stacked on each other. According to one embodiment, some layers assembled together may be divided into layers of materials that have similar properties or that are not deformed upon stamping. For example, the functional member 624 and the conductive member 625, which are made of a relatively rigid material, may be first assembled using an adhesive member, may be then formed to have a desired size through a stamping process, and may be applied to the stacking process of the display 620. According to one embodiment, a relatively soft polymer member 623 (e.g., a cushion member) may be assembled with an adhesive member 6231 (e.g., an embossed tape member) including a release paper, may then be formed to have a desired size through a stamping or cutting process, and may be applied to the stacking process of the display 620.

According to various embodiments, the respective component layers of the display 620 may be stacked on the front plate 621 to have a normal step structure in which at least a part of a lower component layer in the filler introduction direction protrudes relative to a component layer disposed thereon. According to one embodiment, the respective component layers of the display 620 may be disposed such that when the rear face of the front plate 621 is viewed from above, the total lengths of the components layers are the same or are reduced toward the upper side. According to one embodiment, the respective component layers of the display 620 may be stacked to have a normal step structure and to be horizontally symmetrically with respect to the center.

According to various embodiments, the component layers of the display disposed between the front plate and the first face of the housing are cut and stacked in a pattern in which the lengths and/or areas thereof are increased toward the rear face 3212 of the front plate 321. For example, the normal step structure may include a structure in which a viscous waterproof filler is stably brought into contact with each of the component layers without generating a space such as an undercut, a cavity, a groove, or the like in the filling direction of the waterproof filler in a stacking section between the display and the front plate.

Referring to FIG. 6B, the respective component layers of the display 620 may be stacked to have a normal step structure in which, when the rear face of the front plate 621 is viewed from above, at least a part of a lower component layer protrudes relative to a component layer disposed thereon, and to have an eccentric structure. This configuration may mean that each component layer of the display 620 may accommodate a certain degree of assembly tolerance within an allowable error range.

Figure 7:
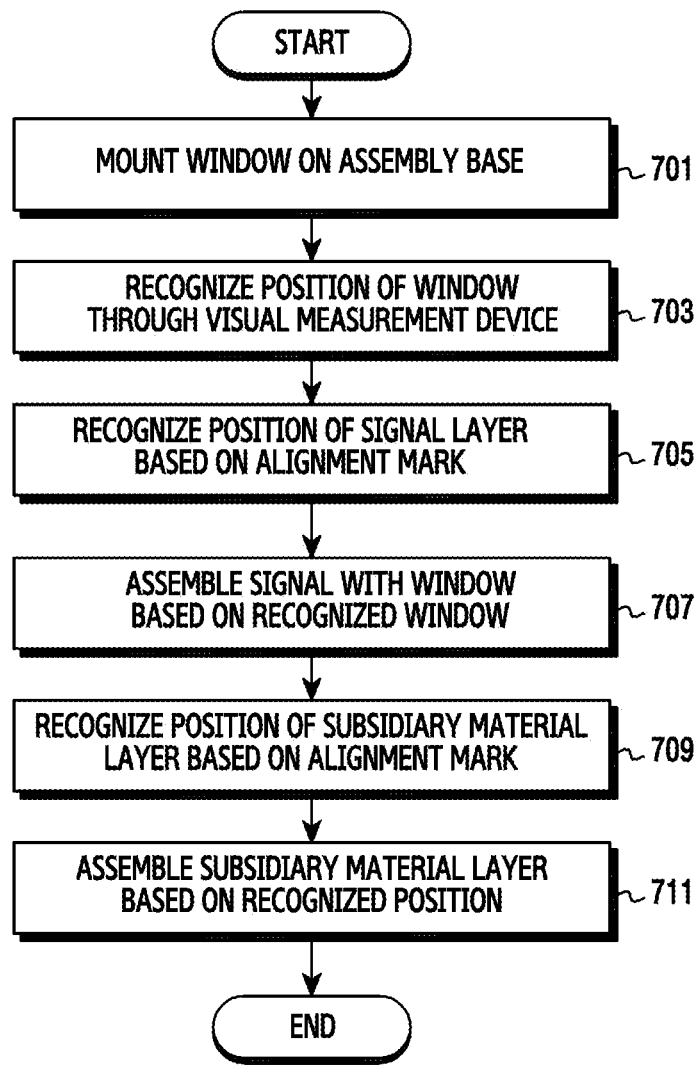
FIG. 7 illustrates a process flowchart of a display assembly procedure according to various embodiments of the present disclosure.
Figure 8:
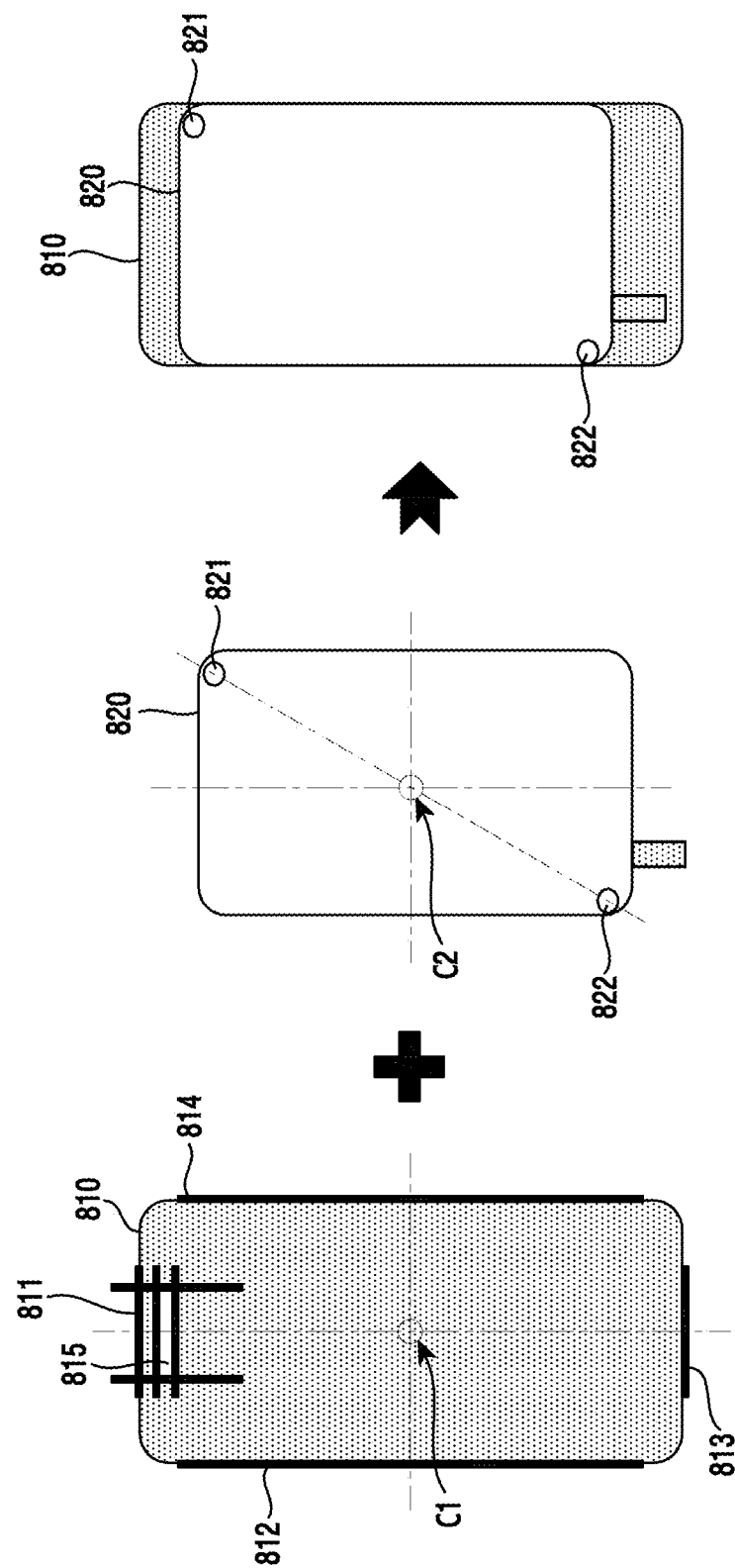
FIG. 8 illustrates an exemplary view of a display alignment procedure according to various embodiments of the present disclosure.

FIG. 7 illustrates a process flowchart of a display assembly procedure according to various embodiments of the present disclosure. FIG. 8 illustrates an exemplary view of a display alignment procedure according to various embodiments of the present disclosure.

Referring to FIGS. 7 and 8, in operation 701, a front plate 810 (e.g., the front plate 321 of FIG. 3) may be mounted on the assembly base. According to one embodiment, the front plate 810 may be formed of a transparent glass material or a synthetic resin material. According to one embodiment, the front plate 810 may be formed in a flat shape. According to one embodiment, the front plate 810 may be formed such that at least a part of the front plate 810 has a bent region.

In operation 703, the position of the front plate 810 (e.g., the front plate 321 of FIG. 3) mounted on the base can be recognized through a visual measurement device (e.g., a visual inspection device). According to one embodiment, as illustrated in FIG. 8, when the front plate 810 is formed in a rectangular shape, the position of the front plate 810 may be recognized through alignment lines 811, 812, 813, and 814 (see FIG. 8) formed in at least a part of the four edges. According to one embodiment, the visual measurement device may recognize the position of the front plate 810 through an opening 815 (e.g., a speaker hole) for exposing an electronic component exposed to the outside of the electronic device. According to one embodiment, the visual measurement device may determine a first center C1 based on the alignment lines 811, 812, 813, and 814 described above.

In operation 705, as illustrated in FIG. 8, the positions of multiple layers 820 (e.g., the multiple layers 322 of FIG. 3) to be stacked on the front plate 810 (e.g., the front plate 321 of FIG. 3) can be recognized using alignment marks 821 and 822 arranged in at least a partial region of the multiple layers 820 through the visual measurement device. According to one embodiment, the multiple layers 820 (e.g., the multiple layers 322 of FIG. 3) may include a touch sensor (e.g., the touch sensor 3221 of FIG. 3) and a display panel (e.g., the display panel 3222 of FIG. 3). According to one embodiment, alignment marks 821 and 822 may be disposed using an inactive region (e.g., a BM region) of the display panel 3222. According to one embodiment, the visual measurement device is able to recognize the positions of the multiple layers 820 based on the above-described alignment marks 821 and 822, and to determine a second center C2.

In operation 707, the multiple layers 820 (e.g., the multiple layers 322 of FIG. 3) may be assembled to the front plate 810 based on the recognized positions. According to one embodiment, the front plate 810 and the multiple layers 820, the positions of which are recognized through the visual measurement device, can be assembled in the state in which the positions thereof are aligned with each other. For example, it may be possible to assemble the front plate 810 and the multiple layers 820 using separate assembly jigs in the state of being aligned with each other based on the first center point C1 of the front plate 810 and the second center point C2 of the multiple layers 820, which are detected through the visual measurement device.

In operation 709, the position of a subsidiary material layer (e.g., the subsidiary material layer 323 of FIG. 3) may also be recognized based on alignment marks disposed at predetermined positions in the manner described above, and in operation 711, the subsidiary material layer may be assembled on the multiple layers 820 (e.g., the multiple layers 322 of FIG. 3) based on the recognized position.

Figure 9A:
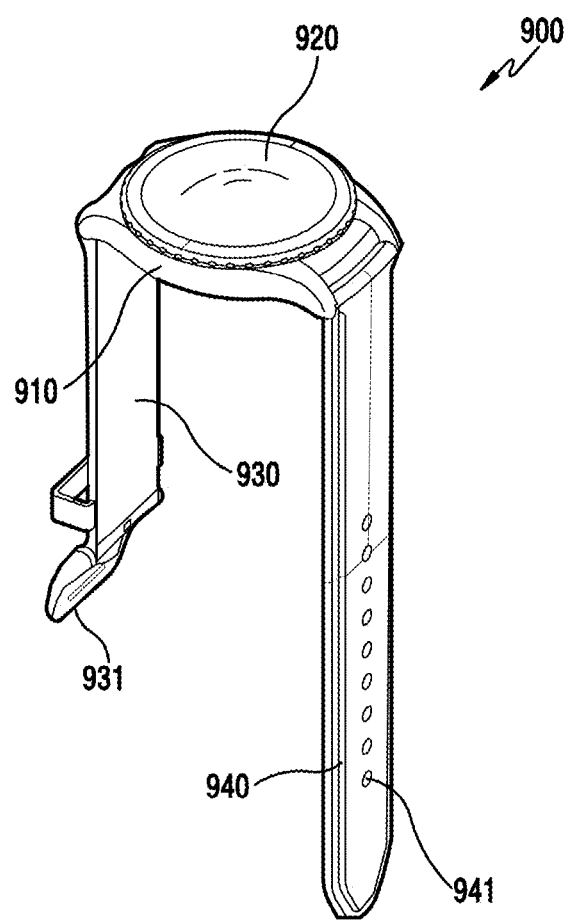
FIGS. 9A and 9B illustrates a perspective view of a wearable electronic device according to various embodiments of the present disclosure and a cross-sectional view of a main portion of the wearable electronic device, respectively.
Figure 9B:
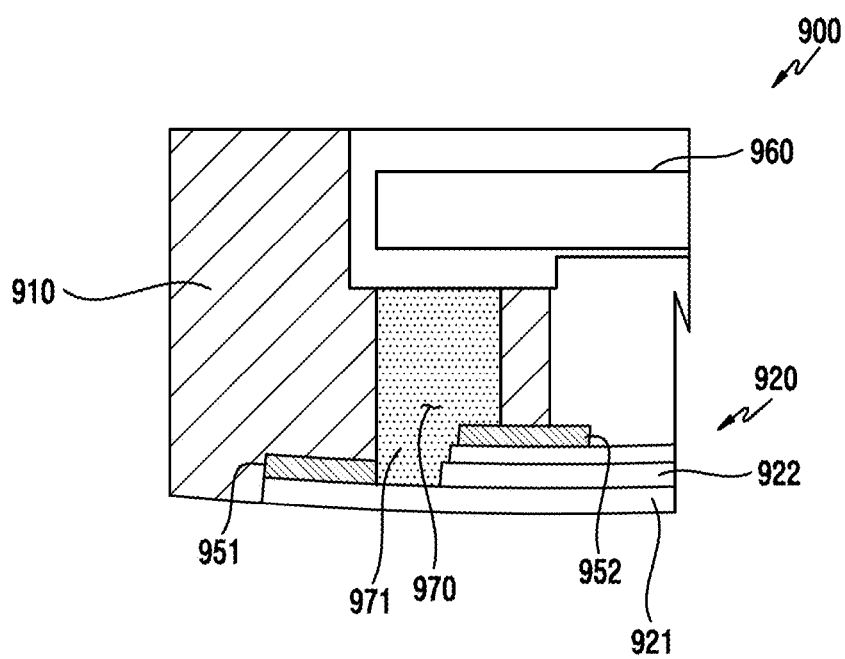

FIGS. 9A and 9B illustrates a perspective view of a wearable electronic device according to various embodiments of the present disclosure and a cross-sectional view of a main portion of the wearable electronic device, respectively.

Referring to FIGS. 9A and 9B, a wearable electronic device 900 may include a housing 910 and a pair of straps 930 and 940 each mounted on at least one side of the housing 910. According to one embodiment, one strap 930 may be provided with a buckle member 931, and the remaining strap 940 may include a plurality of openings 941 formed to receive a positioning fixed pin included in the buckle member 931. According to one embodiment, the housing 910 of the wearable electronic device 900 can be worn on the user's wrist by the pair of straps 930 and 940.

According to various embodiments, the housing 910 may include a display 920. According to one embodiment, the display 920 may be formed in a curved shape. According to one embodiment, the display 920 may be formed in a flat shape. According to one embodiment, the display 920 may include a touch screen display.

Referring to FIG. 9B, the display 920 may include a window 921 formed to have a predetermined radius of curvature, and multiple layers 922 stacked on the rear face of the window 921. According to one embodiment, the multiple layers 922 may include a touch sensor (e.g., the touch sensor 3221 of FIG. 3), a display panel (e.g., the display panel 3222 of FIG. 3), and a subsidiary material layer (e.g., the subsidiary material layer 323 of FIG. 3). According to one embodiment, respective components may be arranged to have a normal step structure in which at least a part of a lower component layer protrudes relative to a component layer disposed thereon when the rear face of the window 921 is viewed from above.

According to various embodiments, the display 920 may be fixed to the housing by a first seal member 951 interposed between a part of the window 921 and the housing 910 and a second seal member 952 interposed between a part of the multiple layers 922 and the housing 910. According to one embodiment, the waterproof filler 971 may be filled in a space 970 formed between the first seal member 951 and the second seal member 952. According to one embodiment, a touch sensor (e.g., the touch sensor 3221 of FIG. 3), a display panel (e.g., the display panel 3222 of FIG. 3), and a subsidiary material layer (e.g., the subsidiary material layer 323 of FIG. 3) are disposed in a normal step structure in which, when the rear face of the window 921 is viewed from above, the touch sensor (e.g., the touch sensor 3221 of FIG. 3) protrudes relative to the display panel (e.g., the display panel 3222 of FIG. 3) and the display panel protrudes relative to the subsidiary material layer (e.g., the subsidiary material layer 323 of FIG. 3). Therefore, a viscous waterproof filler 971 is brought into close contact with the edge portions of the respective component layers, so that a stable waterproof structure can be implemented.

According to various embodiments of the present disclosure, in an electronic device, a stacked structure between component layers of a display is improved in such a manner that the adhesive force between a waterproof filler applied to the stepped region between the front plate (e.g., the window) and the display can be secured, whereby it is possible to provide an electronic device having a stable waterproof structure.

According to various embodiments, it is possible to provide an electronic device including: a housing including a first face, a second face that faces a direction opposite the first face, and a side face that encloses a space between the first face and the second face; a front plate disposed on the first face of the housing; a display disposed between at least a partial region of the front plate and the first face, and having a first layer and a second layer which are sequentially stacked; at least one first seal member disposed between an edge portion of the display and the first face; at least one second seal member disposed between an edge portion of the front plate and the first face; and a waterproof filler applied to fill a stepped region formed between the first seal member and the second seal member due to a thickness of the display. The first layer and the second layer are disposed such that the first layer is closer to the front plate than the second layer, and when a rear face of the front plate is viewed from above, a part of the first layer protrudes from the second layer in the stepped region.

According to various embodiments, the first layer may include a touch sensor, and the second layer may include a display panel.

According to various embodiments, the display may include a first adhesive member configured to attach the first layer to the rear face of the front plate, and a second adhesive member configured to attach the second layer to the first layer when the second layer is stacked on the first layer. The first adhesive member and the second adhesive member are disposed such that, when the rear face of the front plate is viewed from above, a part of the first adhesive member protrudes from the first layer in the stepped region, and a part of the second adhesive member protrudes from the second layer in the stepped region.

According to various embodiments, the waterproof filler may be applied to cover an edge portion of the display.

According to various embodiments, the housing may have a filler introduction hole formed in a manner of penetrating the housing from the first face to the second face, and the waterproof filler may be introduced from the second face toward the first face through the filler introduction hole.

According to various embodiments, the waterproof filler may be applied between the first seal member and the second seal member on the first surface of the housing before the front plate and the display are assembled.

According to various embodiments, the total area of the first layer may be equal to or larger than the total area of the second layer.

According to various embodiments, the first layer and the second layer may be disposed symmetrically or eccentrically to one side with respect to a center on the rear face of the front plate.

According to various embodiments, the electronic device may further include at least one subsidiary material layer disposed between the display and the first face.

According to various embodiments, the subsidiary material layer may include a polymer layer stacked on a second member via a third adhesive member, a functional member stacked on the polymer layer via a fourth adhesive member, and a conductive member stacked on the functional member via a fifth adhesive member.

According to various embodiments, the functional member may include an added display, a force touch FPCB, a fingerprint sensor FPCB, a communication antenna radiator, a heat dissipation sheet, a conductive/non-conductive tape, an open cell sponge, or a graphite sheet for heat dissipation.

According to various embodiments, the conductive member may be formed of a metallic material for noise shielding and heat dissipation.

According to various embodiments, the subsidiary material layer may further include an electronic pen detection member configured to detect an input signal of an electronic pen.

According to various embodiments, the polymer layer, the functional member, the conductive member, and the electronic pen detection member may be stacked on the display after at least two of the polymer layer, the functional member, the conductive member.

According to various embodiments, the electronic device may further include a rear plate disposed on the second face of the housing, and at least one third seal member disposed between the rear plate and the second face.

According to various embodiments, the waterproof filler may contain a semisolid or liquid material that is solidified by a natural or external condition.

According to various embodiments, it is possible to provide an electronic device including: a housing including a front plate, a rear plate spaced apart from the front plate and facing the front plate, and a side structure directly or indirectly connected to the front plate and the rear plate, wherein the front plate includes a first flat portion that faces in the first direction, and a first side surface portion extending to be curved from an edge of the first flat portion toward the rear plate, wherein the second plate includes a second flat portion that faces in a second direction opposite to the first direction, and wherein, when the front plate is viewed from above, the first flat portion and the first side face portion together form a rectangular shape including a first edge portion extending in a third direction perpendicular to the first direction and having a first length, and a second edge portion extending in a fourth direction perpendicular to the first direction and the third direction and having a second length longer than the first length; a touch screen display that faces in the first direction and is exposed through the front plate, wherein the touch screen display includes multiple layers, a first layer, and a second layer, which are stacked each other, and the first layer and second layer are disposed such that the first layer is closer to the front plate than the second layer, and when the rear plate is viewed from above, a part of the first layer protrudes from the second layer in a region adjacent to a point where the first edge portion and the second edge portion meets each other; a filler formed in the region; and a processor electrically connected to the touch screen display.

According to various embodiments, the first layer may be an Optically Clear Adhesive Layer (OCA) layer, and the second layer may include a touch sensor.

According to various embodiments, the electronic device may further include a third layer disposed farther away from the front plate than the second layer, and the second layer and the third layer may be disposed such that when the rear plate is viewed from above, a part of the second layer protrudes from the third layer in the stepped region.

According to various embodiments, the third layer may include an Organic Light-Emitting Display (OLED) layer.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
    a housing comprising a front plate, a rear plate spaced apart from the front plate and facing the front plate, and a side structure connected to the front plate and the rear plate, wherein:
        the front plate comprises a first flat portion that faces in a first direction, and a first side face portion extending from an edge of the first flat portion toward the rear plate,
        the rear plate comprises a second flat portion that faces in a second direction opposite to the first direction, and
        when the front plate is viewed from above, the first flat portion and the first side face portion together form a rectangular shape comprising a first edge portion extending in a third direction perpendicular to the first direction and including a first length, and a second edge portion extending in a fourth direction perpendicular to the first direction and the third direction and including a second length longer than the first length;
    a touch screen display that faces in the first direction and is coupled to the front plate, wherein the touch screen display comprises a first layer, a second layer, and a third layer, that are stacked on each other, and the first layer and second layer are disposed such that the first layer is closer to the front plate than the second layer, and the second layer and the third layer are disposed such that the second layer is closer to the front plate than the third layer, and when the rear plate is viewed from above, a part of the first layer protrudes from the second layer and a part of the second layer protrudes from the third layer in a region adjacent to a point where the first edge portion and the second edge portion meets each other;
    a filler formed in the region; and
    a processor electrically connected to the touch screen display.

2. The electronic device of claim 1, wherein the first layer is an Optically Clear Adhesive (OCA) layer, and the second layer includes a touch sensor.

3. The electronic device of claim 1, wherein the third layer includes an Organic Light-Emitting Display (OLED) layer.

4. The electronic device of claim 1, wherein the first side face portion is extended to be curved from the edge of the first flat portion toward the rear plate.

5. The electronic device of claim 1, wherein the region comprises a stepped region.

6. The electronic device of claim 1, wherein, when the front plate is viewed from above, a part of the front plate protrudes from the touch screen display, and
    further comprising a seal member between the side structure and the part of the front plate.

7. The electronic device of claim 1, wherein the touch screen display further comprises:

multiple layers disposed farther away from the front plate than the third layer, and the third layer and the multiple layers are disposed such that when the rear plate is viewed from above, a part of the third layer protrudes from the multiple layers in the region.

8. The electronic device of claim 7, wherein the multiple layers include a digitizer relevant to an electronic pen.

9. The electronic device of claim 1, wherein the filler is formed by solidifying a semisolid or liquid material.

10. The electronic device of claim 1, wherein the touch screen display is flexible.

* * * * *